United States Patent
Nakano et al.

(10) Patent No.: US 6,837,631 B2
(45) Date of Patent: Jan. 4, 2005

(54) SUBSTRATE PROCESSING METHOD AND SUBSTRATE PROCESSING APPARATUS

(75) Inventors: Masayuki Nakano, Minato-Ku (JP); Yoichi Deguchi, Minato-Ku (JP)

(73) Assignee: Tokyo Electron Limited, Tokyo-To (JP)

( * ) Notice: Subject to any disclaimer, the term of this patent is extended or adjusted under 35 U.S.C. 154(b) by 217 days.

(21) Appl. No.: 09/928,409

(22) Filed: Aug. 14, 2001

(65) Prior Publication Data

US 2002/0022195 A1 Feb. 21, 2002

(30) Foreign Application Priority Data

Aug. 15, 2000 (JP) ........................................ 2000-246223

(51) Int. Cl.⁷ ................................................ G03D 5/00
(52) U.S. Cl. ........................ 396/611; 118/52; 427/240
(58) Field of Search .............................. 396/604, 611, 396/627; 118/52–56, 319–321; 427/240; 134/903, 1, 1.3, 902; 430/311

(56) References Cited

U.S. PATENT DOCUMENTS 5,843,627 A * 12/1998 Bok ........................... 430/328
6,357,938 B1 * 3/2002 Noh ........................... 396/611
2001/0001392 A1 * 5/2001 Hirae et al. .................. 134/1.3

FOREIGN PATENT DOCUMENTS

| JP | 03-270132 | * 12/1991 |
| JP | 05-315310 | * 11/1993 |
| JP | 06-283414 | * 10/1994 |
| JP | 2000-07885 | * 3/2000 |

* cited by examiner

Primary Examiner—D. Rutledge
(74) Attorney, Agent, or Firm—Oblon, Spivak, McClelland, Maier & Neustadt, P.C.

(57) ABSTRACT

A developing process of the photo-resist coated on the wafer is performed, cleaning the developing solution by a cleaning solution then transferring the wafer to the electron beam radiation unit before the rinsing solution and the resist dries out. The radiation chamber is replaced with a helium gas to form a predetermined degree of vacuum or atmospheric pressure. An electron beam is radiated and the front face of the wafer is heated for a predetermined period of time. In this method, deformation and breaking of a pattern caused by drying after the development can be prevented.

12 Claims, 10 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for reforming a coating film by radiating a semi-conductor wafer with a beam.

2. Description of the Related Art

In a photolithography step of a semiconductor device manufacture, photo-resist is applied on the surface of a semi-conductor wafer (a resist application step) after printing mask patterns on the resist surface (an exposure step), a photo sensitive portion of the resist or a photo insensitive portion thereof is dissolved in developing solution selectively and the developing solution is washed away by rinsing solution (a development step) to form the resist patterns on the front face of a wafer. Line width of the resist patterns of the late years tends to be remarkably minute as technology advances.

However, because the line width of the resist patterns are too minute, especially when aspect ratio is high, hardness of the resist suitable for the aspect ratio is not obtained in the process of printing patterns, resulting in deformation of patterns or breaking thereof.

In particular, in a development step, substrate is spun with high speed in order to wash away the developing solution between the patterns with rinsing solution, and dried by scattering the rinsing solution, pattern breaking caused by the centrifugal force of the rotation occurred.

SUMMARY OF THE INVENTION

An object of the present invention is to provide a substrate processing method and a substrate processing apparatus that is capable of preventing patterns from being deformed or broken.

Another object of the present invention is to provide, in particular, substrate processing method and a substrate processing apparatus that is capable of hardening resist after developing process, and improving adhesion thereof to a wafer.

In order to accomplish the above-described objects, a first aspect of the present invention is a substrate processing method, comprising the steps of (a) forming at least a predetermined pattern on the substrate, (b) performing a treatment using an aqueous solution on the substrate after the step (a) and (c) radiating a beam with a wavelength shorter than that of a visible ray on the substrate.

A second aspect of the substrate processing method, comprising the steps of (a) developing a photo sensitive material on the substrate with a developing solution, (b) cleaning the developing solution with a cleaning solution and (c) radiating a beam with a wavelength shorter than that of a visible ray on the photo sensitive material before the photo sensitive material and the cleaning solution are dried out.

A third aspect of the substrate processing method, comprising the steps of applying a photo sensitive material on the substrate, radiating a beam with a wavelength shorter than that of a visible ray on the photo sensitive material, developing a photo sensitive material with a developing solution and cleaning the developing solution with a cleaning solution.

A fourth aspect of the substrate processing method, comprising the steps of heating the substrate at a first temperature, radiating a beam with a wavelength shorter than that of a visible ray on the photo sensitive material after the heating and heating the radiated substrate at a second temperature higher than the first temperature.

A fifth aspect of the substrate processing method, comprising the steps of (a) forming at least a predetermined pattern on the substrate, (b) performing a treatment using an aqueous solution on the substrate after the step (a), and (c) splashing the aqueous solution between the patterns after the step (b) with a predetermined electromagnetic energy.

A sixth aspect of the substrate processing apparatus comprising, a development and cleaning portion for developing and cleaning the developing solution with a cleaning solution and a radiating portion for radiating a beam with a wavelength shorter than that of a visible ray on the photo sensitive material before the photo sensitive material and the cleaning solution are dried out.

In the present invention, because photo sensitive material is hardened and reformed by, for example, electron beam in the state that the substrate is not completely dried after the developing process, deformation and breaking of a pattern caused by drying after the development and by the surface tension of cleaning solution is prevented, and adhesion of photo sensitive material to the substrate can be improved.

In the present invention, because photo sensitive material is hardened and reformed by, for example, electron beam after coating photo sensitive material, patterns are prevented from being deformed or broken and adhesion of photo sensitive material to the substrate can be improved in the later step.

These objects and still other objects and advantages of the present invention will become apparent upon reading the following specification when taken in conjunction with the accompanying drawings

DETAILED DESCRIPTION OF THE PREFERRED EMBODIMENT

Hereinafter, embodiments of the present invention will be described with reference to the drawings.

Figure 1:
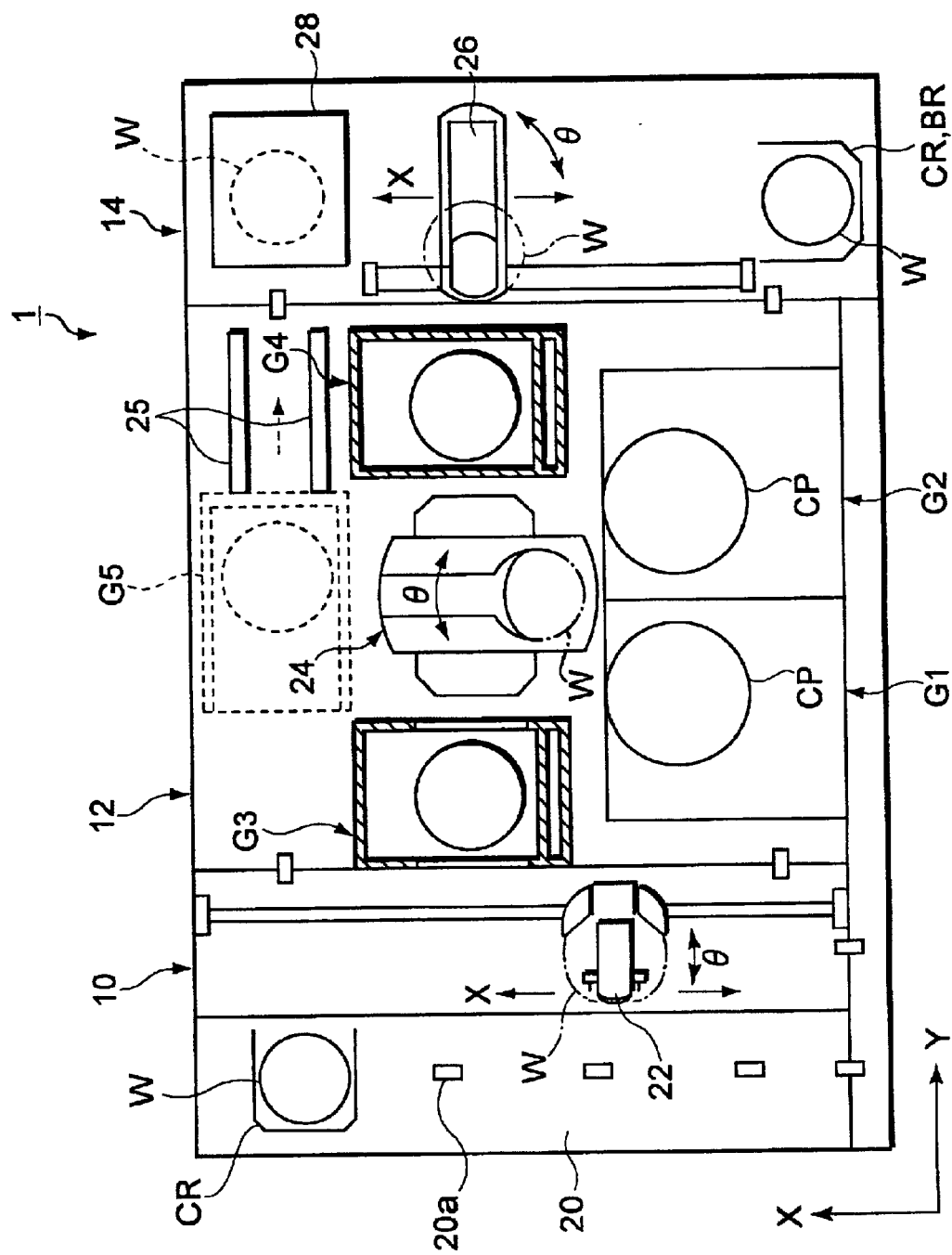
FIG. 1 is a plan view showing the whole construction of a substrate processing apparatus for a semiconductor wafer to which the present invention is applied.
Figure 2:
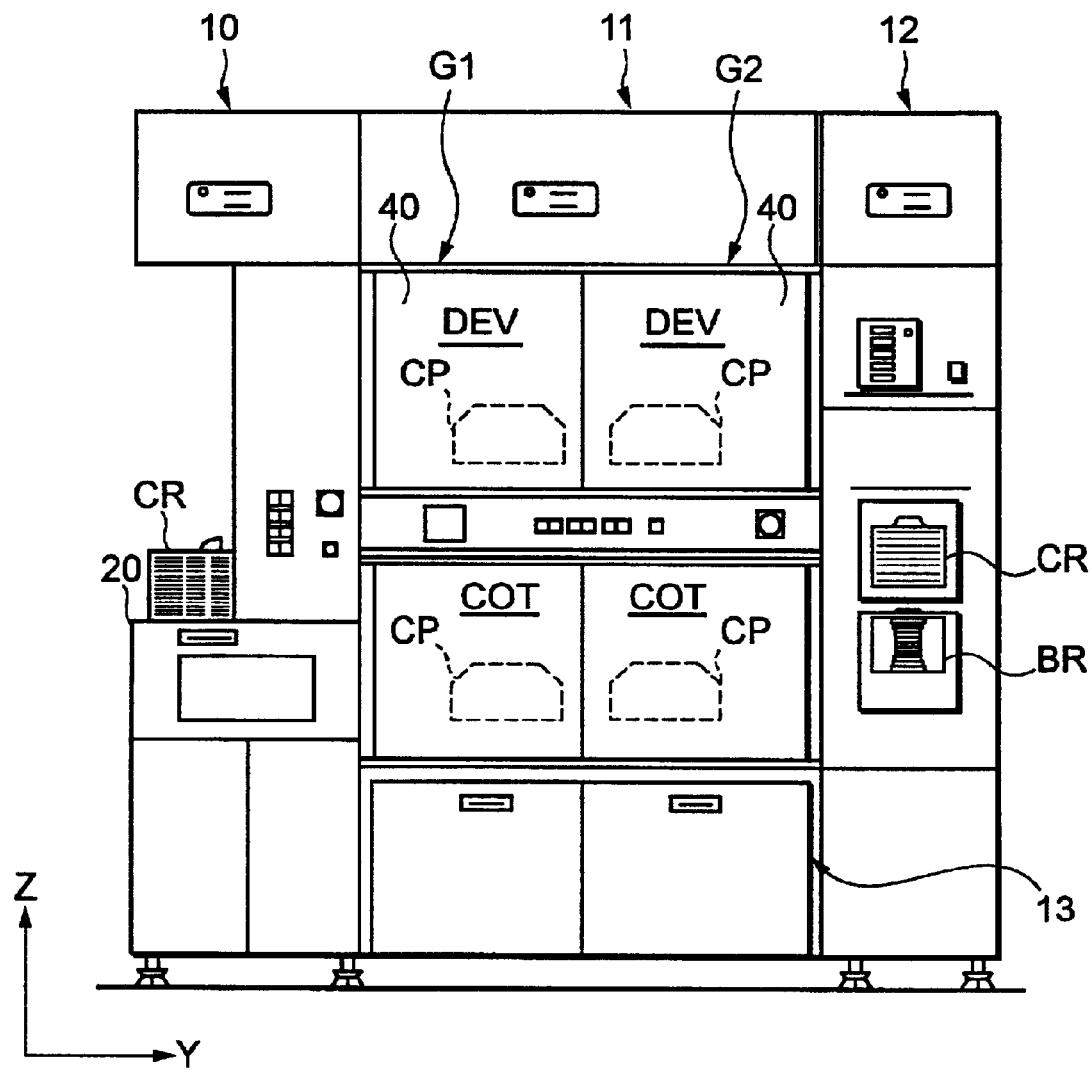
FIG. 2 is a front view showing the whole construction of the same substrate processing apparatus.
Figure 3:
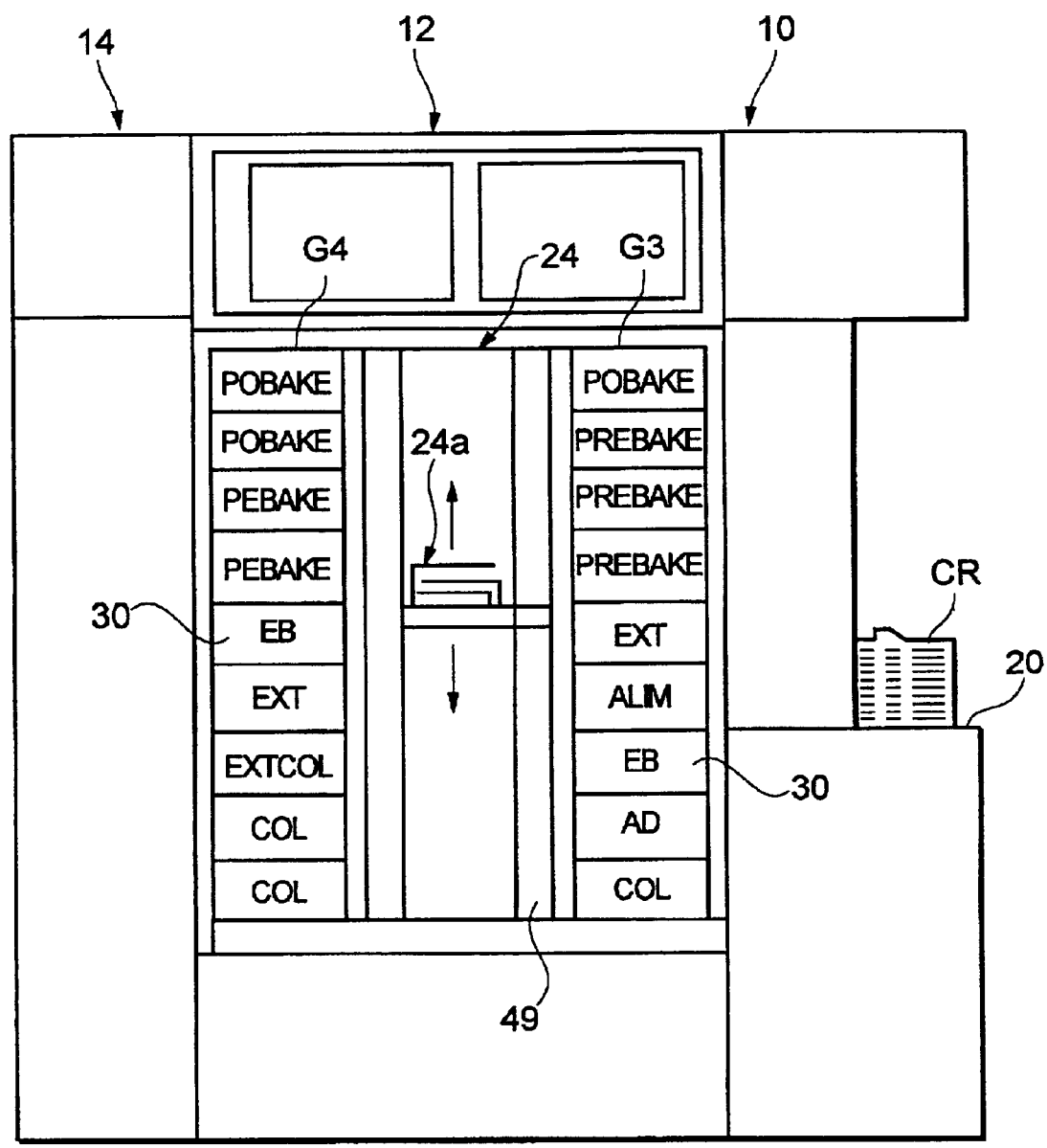
FIG. 3 is a rear view showing the whole construction of the same substrate processing apparatus.

FIGS. 1, 2 and 3 are the views showing a total configuration of a substrate processing apparatus in an embodiment of the present invention. FIG. 1 is a plan view, FIG. 2 is a front view and FIG. 3 is a rear view.

A coating and developing system 1 is comprised of a cassette station 10 for carrying a plurality of, for example, 25 semiconductor wafers per a wafer cassette CR as a unit, into or out of the system from or to an outside, and carrying the wafer w in and out of the wafer cassette CR, a processing station 12 constituted by stacking various kinds of processing stations each for performing predetermined processing for the wafers W one by one in the resist coating process at predetermined locations in multiple tiers, an aligner provided adjacent to the processing station 12 (not shown) and a interface section 14 for transferring wafer W are integrally connected.

In the cassette station 10, as shown in FIG. 1, a plurality of, for example, up to four cassettes CR are placed in a line in an X-direction with respective outlet and inlet ports for the wafer W facing the processing station 11 side at positions of projections 20a provided for alignment thereof on a cassette mounting table 20. A wafer transfer mechanism 22 movable in the direction of arrangement of the cassettes (an X-direction) and in the direction of arrangement of the wafers housed in the wafer cassette CR (a vertical direction) is structured to be selectively accessible to each of the wafer cassettes CR. Further, the wafer transfer mechanism 22 is structured to be rotatable in a θ-direction so as to be accessible to an alignment unit (ALIM) and extension unit (EXT) included in a multistage station section of a third unit group G3 at the processing station 12 side as will be described later.

In the processing station 12, as shown in FIG. 1, a vertical carrier type of a main wafer transfer mechanism 24 is provided at the center, around which a pair of or a plurality of pairs of all processing stations are multi-tiered. In this example, five groups G1, G2, G3, G4 and G5 are disposed multi-tired. The multi-tired units of the first and the second groups G1 and G2 are disposed on the front side of the system adjacent with each other, (the front in FIG. 1). The multi-tired units of the third group G3 is disposed adjacent to the cassette station 10. The multi-tired unit of the fourth group G4 is disposed adjacent to the interface section 12, and the multi-tired unit of the fifth group G5 is disposed on the rear side. In addition, the fifth group G5 is configured as such that it is movable along with a rail 25, for the purpose of maintaining the main wafer transfer mechanism 24.

The main wafer transfer mechanism 24 has a transfer mechanism 24a as shown in FIG. 3, which is configured to be rotatable in the θ-direction. The wafer transfer mechanism 24a is movable and accessible in the directions of X, Y and Z in order to transfer the wafer W to each surrounding processing unit.

In the first group G1, as shown in FIG. 2, two spinner-type processing units for performing predetermined processing while the wafer W is mounted on a spin chuck within a cup CP, for example, a resist coating unit (COT) and a developing processing unit (DEV) are two-tiered from the bottom in order. In the second group G2, two spinner-type processing units, for example, a resist coating unit (COT) and a developing processing unit (DEV) are two-tiered from the bottom in order. It is preferable for the resist coating units (COT) to be disposed in the lower tire because drainage of resist solution is troublesome from a point of view of both maintenance and its structure. However, it is possible to dispose the resist coating unit in the upper tire when necessary.

As shown in FIG. 3 in the third group G3, an oven type processing unit, for example, a cooling unit (COL), an adhesion unit (AD), an electron beam radiation unit (EB) 30 of the present invention, an alignment unit (ALIM), an extension unit (EXT), three pre-baking units (PEBAKE) and a post-baking units (POBAKE) are multi-tiered from the bottom in order. In the fourth group G4, an oven type processing unit, for example, two cooling units (COL), an extension and cooling unit (EXTCOL), an extension unit (EXT), an electron beam radiation unit (EB) 30 of the present invention, two post-exposure baking units (PEBAKE) and two post-baking units (POBAKE) are multi-tiered from the bottom in order.

The heat influence between each unit can be reduced by disposing the cooling unit (COL) and the extension cooling unit (EXTCOL) which performs processes at low temperature, in lower tire, and disposing the baking unit (PREBAKE), the post-baking unit (POBAKE) and the adhesion unit (AD) which performs processes at high temperature in upper tier as described herein. However, the units may be disposed in multi-tire at random.

The interface portion 14 is configured so as to be the same size as the processing station 12 in the depth direction, but smaller in the width direction. A transportable pickup cassette CR and a fixed-type buffer cassette BR are two-tiered at the front of the interface section 14, whereas, an edge exposure unit 28 is disposed at the rear, and a wafer transfer mechanism 26 is further provided at the center. The wafer transfer mechanism 26 is configured to move in the X-direction and the vertical direction to get access to both the cassettes CR, BR and the edge exposure unit 28. In addition, the wafer transfer mechanism 26 can be rotated in the θ-direction and also can be accessed to the extension unit (EXT) in the multi-tiered units of the fourth unit group G4 on the processing station 12 side and also to a wafer delivery table (not shown) on the adjacent aligner side.

Figure 4:
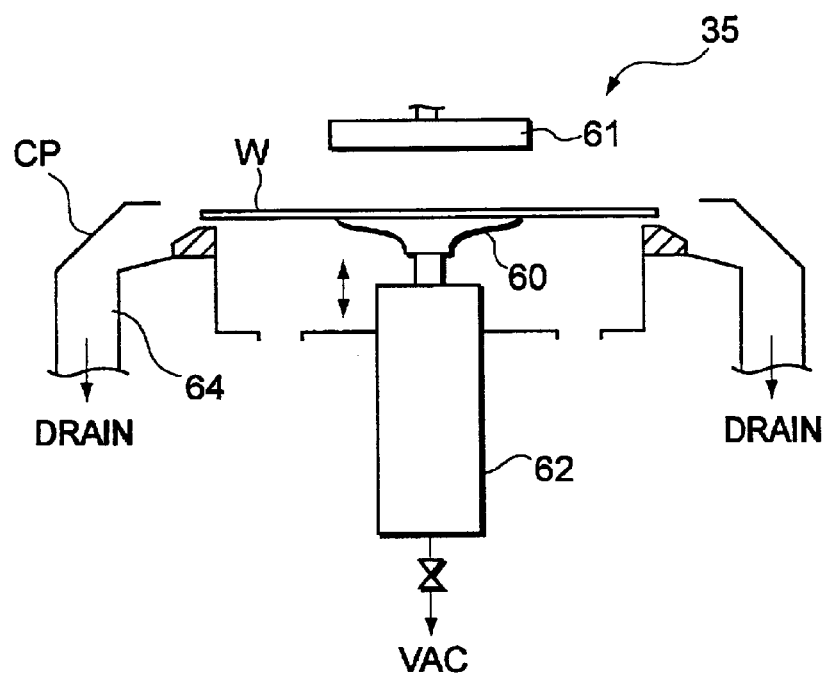
FIG. 4 is a schematic cross-sectional view of a developer according to the present invention.
Figure 5:
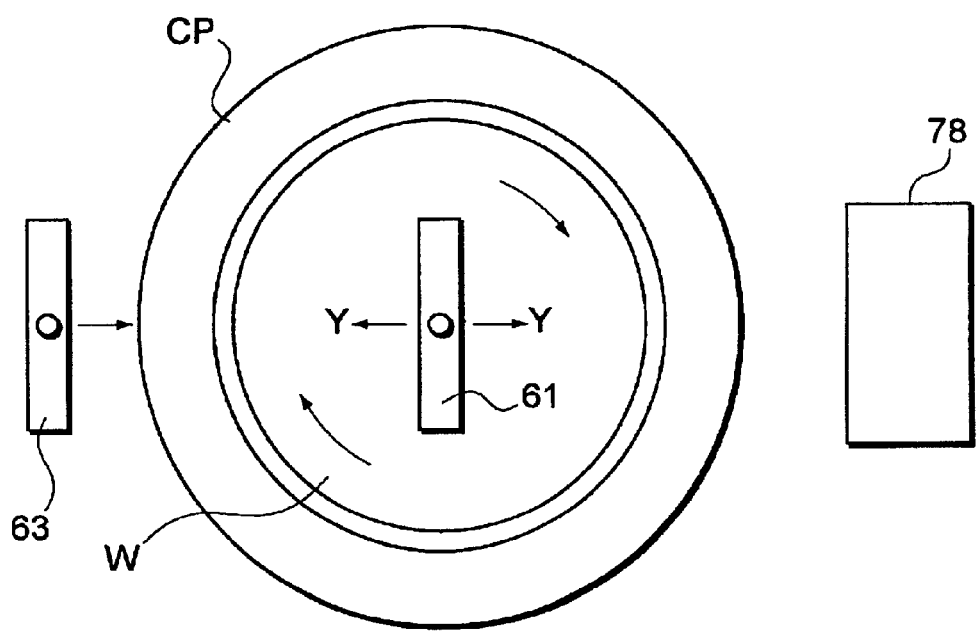
FIG. 5 is a schematic plan view of the same developer.

FIGS. 4 and 5 show schematic cross-sectional view of a developer 35 in the development unit (DEV). A circular cup CP is provided on the developer 35 and a spin chuck 60 is disposed therein. The spin chuck 60 is comprised so as to rotate by the driving force of a driving motor 62 in the state that the wafer W is fixed by means of vacuum suction function. A mechanism for having the driving motor 62 move up and down the spin chuck 60 is also provided. A developing solution discharging nozzle 61 is disposed to supply a developing solution on the surface of the wafer W. The developing solution discharging nozzle 61 is attached to an arm that can be moved by a transfer mechanism (not shown) in the Y direction. The developing solution discharging nozzle 61 can be moved as the arm moves to a nozzle waiting position 78 where the nozzle stands by. In addition, a hole for discharging the developing solution is provided in the developing solution discharging nozzle 61 (not shown). The number of the hole may be one or may be plural. A rinsing solution discharging nozzle 63 supplying a rinsing solution as a cleaning solution in order to wash away the developing solution stands by in the left hand side of the cup CP in FIG. 5. The rinsing solution discharging nozzle 63 can be moved by the same transfer mechanism in the Y direction above the wafer W. In the cup CP, a drain opening 64 for waste fluid is provided, through which the developing solution and the rinsing solution used in the process is discharged.

Figure 6:
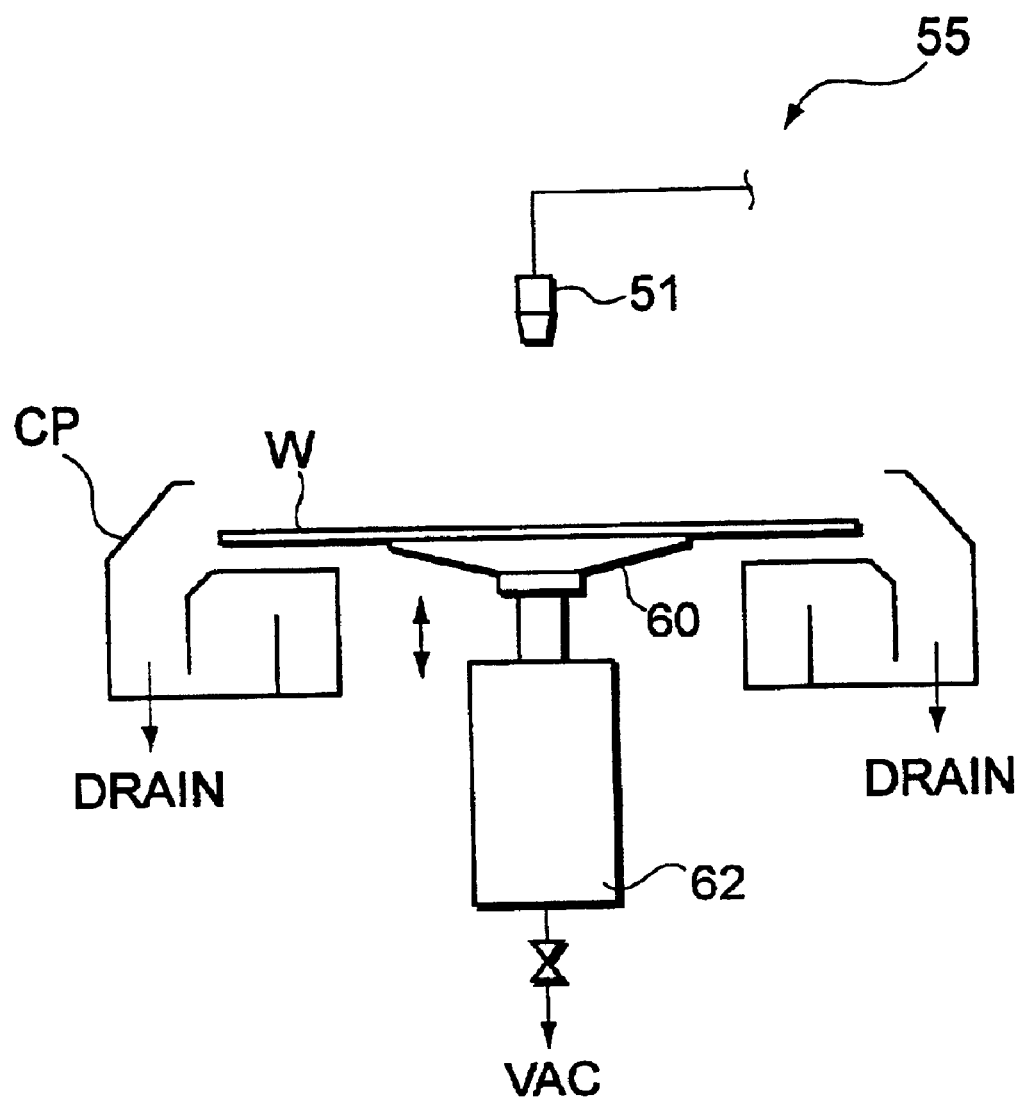
FIG. 6 is a schematic cross-sectional view of a resist coating apparatus according to the present invention.

A schematic cross-sectional view of the resist coating apparatus 55 in a resist coating unit of a spin coating system same as the development unit (DEV) and the coating unit (COT) is shown in FIG. 6. Regarding the resist coating apparatus 55, the spin chuck 60 and the driving motor 62 and the transfer mechanism of the nozzle 51 to discharge photoresist as photo sensitive material on the surface of the wafer W and the like are similar to that of the developer 35. Since the shape of cup CP and the nozzle 51 are merely different from the developer 35 and the shape thereof is not relevant to the spirit of the present invention, the explanation regarding the resist coating apparatus is omitted. In addition, a substance that is insoluble to the electron beam radiation is used as a photo-resist.

Figure 7:
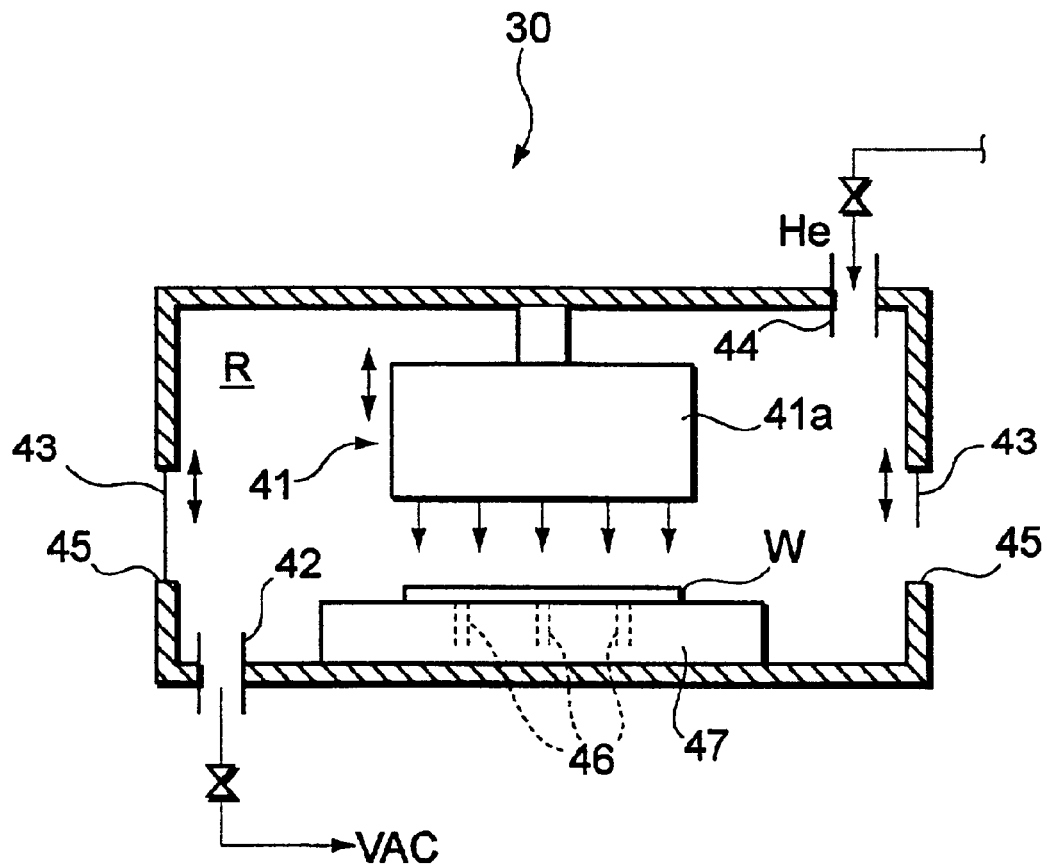
FIG. 7 is a schematic cross-sectional view of an electron beam radiation unit according to the present invention.

Next, a configuration of the electron beam radiation unit (EB) 30 will be described with reference to FIG. 7.

The opening portion 45 for delivering the wafer W by the transfer mechanism 24a (FIG. 3) is provided on both sides of the electron beam radiation unit (EB) 30. A radiation chamber R in the electron beam radiation unit(EB) 30 is hermetically sealed by closing a shutter 43 provided in the both opening portions 45. The shutter can be closed or opened freely. In addition, a gas supply port 44 for taking inert gas, for example, helium gas, from outside the radiation chamber R to the inside thereof is provided on the top of the unit. An exhaust-port 42 is provided on the bottom of the unit. A gas in the radiation chamber R is exhausted with a vacuum pump (not shown) from the exhaust port 42, creating a vacuum in the radiation chamber R.

In the radiation chamber R, a mounting table 47 for mounting the wafer W is disposed near the center on the bottom thereof. Three pins 46 rise and lower when delivering the wafer W by the wafer transfer means 24a (FIG. 3) is incorporated therein. A radiating apparatus 41 for radiating electron beam on the wafer W is disposed on the mounting table 47. The radiating apparatus 41 is structured to be movable in vertical direction and having a plurality of electron beam lamps (not shown) generating electron beam in a housing 41a that has roughly a cylindrical shape.

Figure 8:
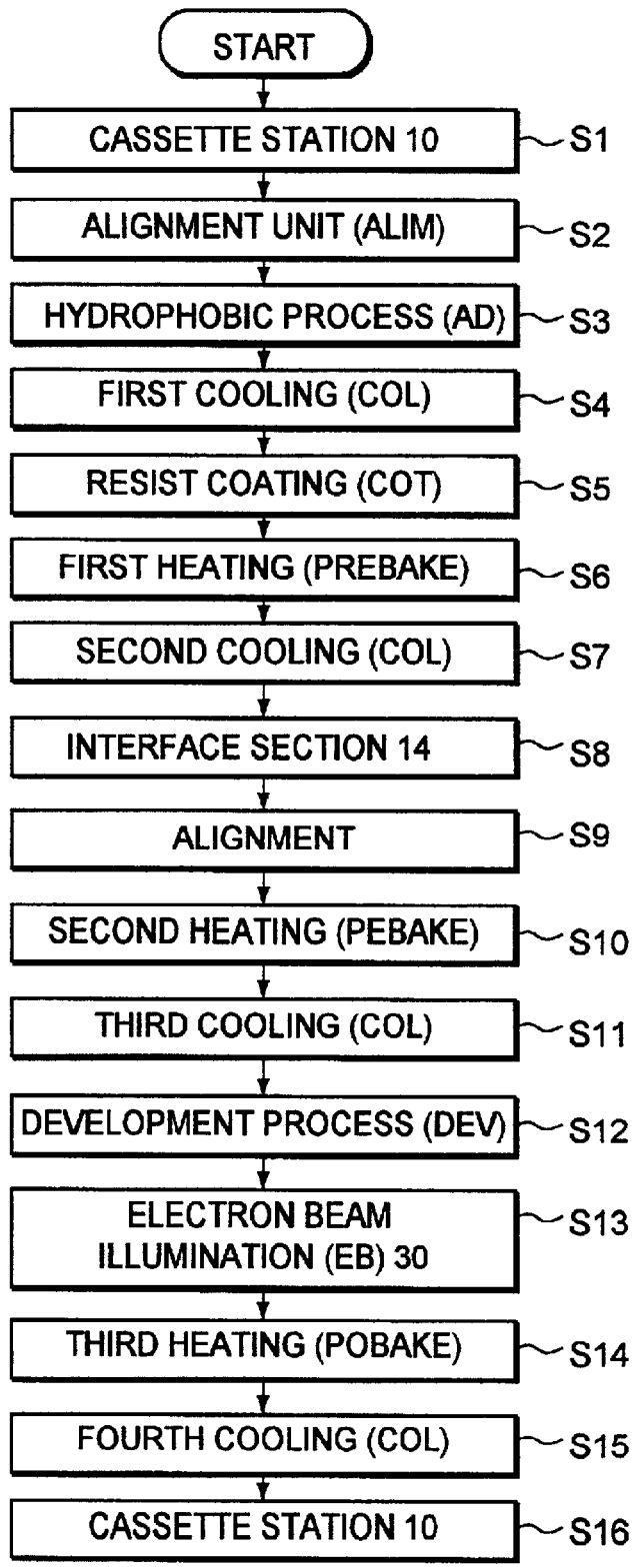
FIG. 8 is a flow chart showing a series of operation in the substrate processing apparatus of the present invention.

An operation of a substrate processing apparatus comprised in the above described manner is explained with reference to the flow chart shown in FIG. 8.

First, in the cassette station 10, the wafer transfer mechanism 22 accesses the cassette CR housing wafers before processing on the cassette mounting table 20, takes out a semi-conductor wafer W from the cassette CR (S1), and transfers to the alignment unit (ALIM). After the alignment of the wafer W in the alignment unit (ALIM) (S2), the wafer W is transferred to the adhesion unit (AD) by the main wafer transfer mechanism 24 (S3), where hydrophobic process is performed. After a predetermined cool processing is performed (the first cooling) in the cooling unit (COL) (S4), the wafer is transferred to the resist coating unit (COT).

In the resist coating unit (COT) in FIG. 6, the spin chuck 60 rises when the wafer W is conveyed to the position right above the cup CP. After vacuum sucking the wafer W, the spin chuck lowers and the wafer W fits in a predetermined position in cup CP (a state shown in FIG. 6) and the nozzle 51 standing by at the nozzle waiting position moves to the center position above the wafer W. Then the regist is supplied and is applied uniformly by rotation of the wafer W (for example, number of rotation is 100 rpm to 3000 rpm) (S5).

Next, a predetermined heat processing (the first heating) is performed in the pre-baking unit (PREBAKE) (S6), cool processing (the second cooling) is performed in the cooling unit (COL) (S7). Then the wafer is transferred by the wafer transferring mechanism 26 to the aligner (not shown) where exposure process is performed (S9), through the interface section 14. After the exposure process, a predetermined heat processing (the second heating) (S10) is performed at the post-exposure baking unit (PEBAKE) and the cool processing (the third cooling) (S11) is performed in the cooling unit (COL). After that the wafer W is transferred to the developing unit (DEV).

In the developing unit (DEV), the spin chuck 60 rises when the wafer W is conveyed to the position right above the cup CP. After vacuum sucking the wafer W, the spin chuck lowers and the wafer W fits in a predetermined position in cup CP (a state shown in FIG. 4) and the nozzle 61 standing by at the nozzle waiting position 78 moves to the center position above the wafer W. Then the developing solution is supplied and is applied uniformly by rotation of the wafer W (for example, 100 rpm to 1000 rpm) (S12). And after predetermined period of time passes, then the rinsing solution discharging nozzle 63 moves to a position right above the wafer W and a rinsing solution, for example a pure water, is discharged. The developing solution is washed away with centrifugal force of the substrate rotation.

Figure 9A:
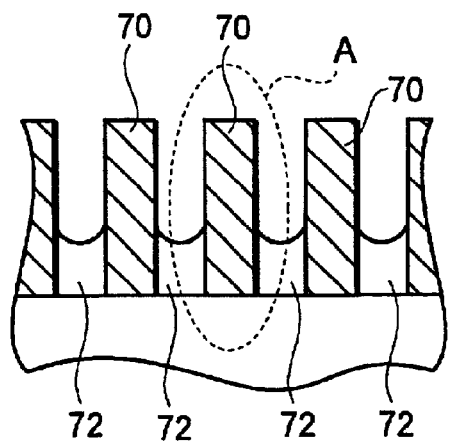
FIG. 9A is a magnified cross-sectional view showing the state that a rinsing solution remains between the patterns.

At that point, scattering the rinsing solution by rotating the wafer W at low speed, for example 30 rpm to 50 rpm, for a predetermined period of time prevents the breaking of the patterns with the centrifugal force. And, as shown in FIG. 9A, the rinsing solution 72 remains between the patterns formed by the resist 70, and the resist 70 itself is not dried out. (In other words, before the resist 70 and the rinsing solution 72 completely dries out or hardens). When completely dried out at this point, the patterns becomes fragile and easy to break. Then the wafer W is transferred to the next step, to the electron beam radiation unit (EB) 30 in the state that is not completely dried out. With this method the resist pattern is transferred to the next step without deformation, breaking and with moisture.

In the electron beam radiation unit (EB), one of the two shutter 43s opens and the wafer W is transferred to the radiation chamber R. The shutter 43 closes while the wafer W is transferred to the pin 46 and placed on the mounting table 47 with lowering of the pin, and a radiation chamber R is hermetically sealed off. Then, the radiation chamber R is formed vacuum to a predetermined degree, and replaced with helium gas so that the pressure inside the chamber is the same, for example, as the atmospheric pressure. And the electron beam is radiated and heats the front face of the wafer W for a predetermined period of time with an accelerating voltage of 30 kV-200 kV by the radiating apparatus 41. In the process, the resist hardens and reforms (S13). In addition, nitrogen gas may be used instead of helium gas, and S13 may be performed in an atmospheric gas with low oxygen concentration in comparison with the oxygen concentration of the air. The process may also be performed under a reduced atmospheric pressure.

Figure 9B:
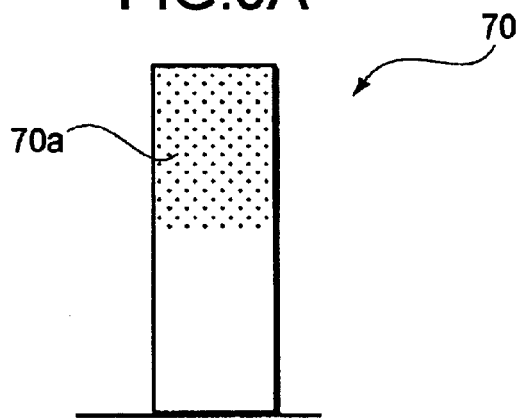
FIG. 9B is a magnified cross-sectional view showing the case where the depth of radiation is small.
Figure 9C:
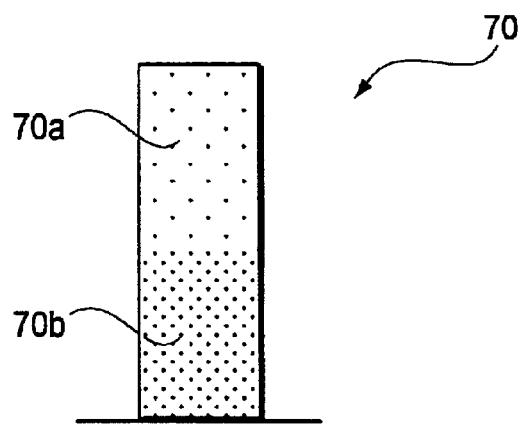
FIG. 9C is a magnified cross-sectional view showing the case where the depth of radiation is large.

Incidentally, electron beam can change a depth that electron reaches into the resist depending on a magnitude of the accelerating voltage. Both FIGS. 9B, and 9C are the schematic diagrams of a magnified image of the "part A" in FIG. 9A. (outlined with a broken line). When hardening the surface of the resist, namely 70a as shown in FIG. 9B (the depth that electron reaches is small), the radiation is performed with low voltage. On the other hand, when hardening the bottom of the resist, namely 70b as shown in FIG. 9C (the depth that electron reaches is large), the radiation is performed with high voltage. Therefore the part to be hardened is selected appropriately. Further, apart from the hardening of the resist in this manner, the surface may be reformed while having a rinsing solution 72 evaporate as shown in FIG. 9A with the electron beam. In addition, the rinsing solution 72 may be splashed with using the electron beam (electromagnetic energy).

After radiation of the electron beam is finished, and the resist achieves a predetermined degree of hardness, the radiation chamber R is depressurized to have the wafer W dried out. At this state, there is no possibility that the resist is being deformed or broken due to the surface tension as the rinsing solution between the patterns dries out, since the resist has already achieved a degree of hardness according to the aspect ratio. As described in this method, hardening the resist without having it completely dried out prevents deformation and breaking caused by drying after the development.

In addition, since the radiation chamber R is filled with helium which has higher heat conductivity than inert gas such as nitrogen, evaporation of the rinsing solution between the patterns by electron beam radiation is encouraged and the wafer W can instantly be dried out. With this method, the task is shortened compared with the case when nitrogen gas is used. Further, employment of inert gas of these kinds is to prevent absorption of light by oxygen by making absence of oxygen. Therefore, radiation may be performed in a vacuum state namely in absence of oxygen without employing these inert gas.

When the electron beam radiation processing is over, a predetermined heat processing (the third heating) is performed in the post-baking unit (POBAKE) (S14). The heat processing is performed, for example, at the temperature of more than 100 degrees Celsius. And after the cool processing (the fourth cooling) is performed in the cooling unit (COL) (S15), the wafer W is returned to the cassette station 10 (S16).

Figure 10:
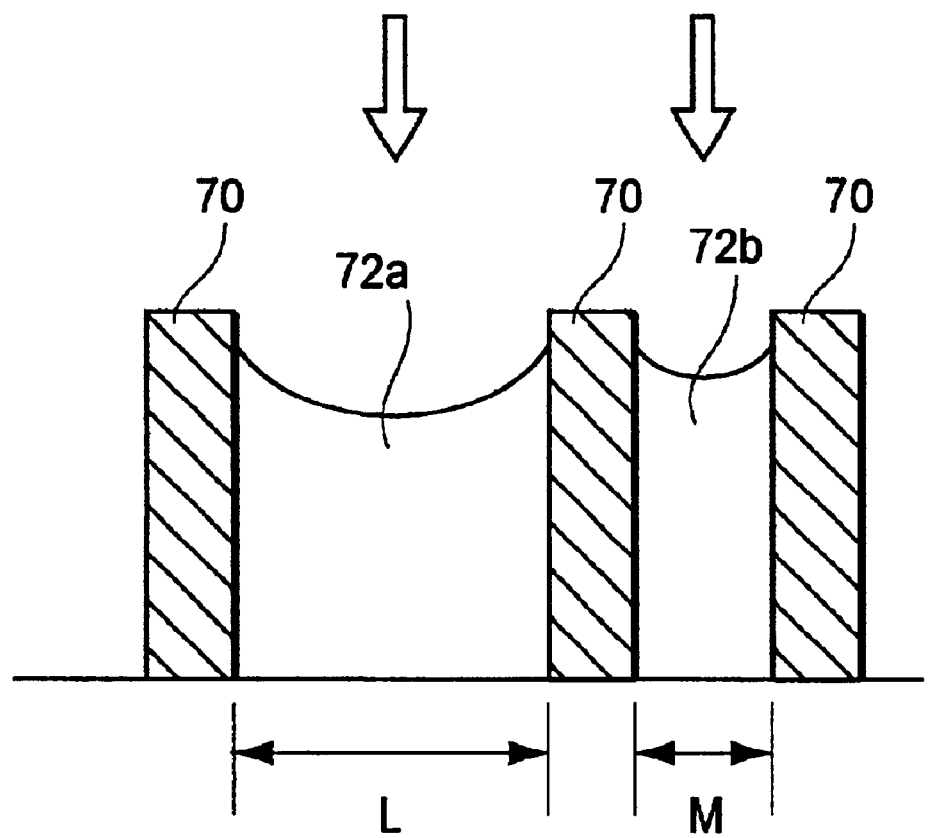
FIG. 10 is a magnified cross-sectional view showing spaces between the resist patterns according to another embodiment of the present invention.

Next, process performed after the development in another embodiment of the present invention is described with reference to FIG. 10. According to the first embodiment, in the development process after the cleaning with the rinsing solution, when a gap L and a gap M are different in size as illustrated, the surface tension of the rinsing solution 72a is larger in the gap L (the wider gap), compared to the surface tension in the gap M (the narrower gap). In this case, a nozzle (not shown) different from the developing solution discharging nozzle 61 and the rinsing solution nozzle 63 as shown in FIG. 5 is provided and a surface-active agent is supplied on the rinsing solution by the nozzle so that the surface tension thereof is reduced. With this method, deformation or breaking of the patterns is prevented, and furthermore, the prevention of the deformation or the breaking is confirmed by radiating the electron beam as in the first embodiment. In addition, the adjustment of such surface tension may be performed by means other than supplying the surface-active agent, for example, by treating the surface, and the like. The prevention of deformation and breaking of the patterns by tractive force between the patterns can also be expected by adjusting the surface tension.

The present invention is not limited to an embodiment as described above.

Figure 11:
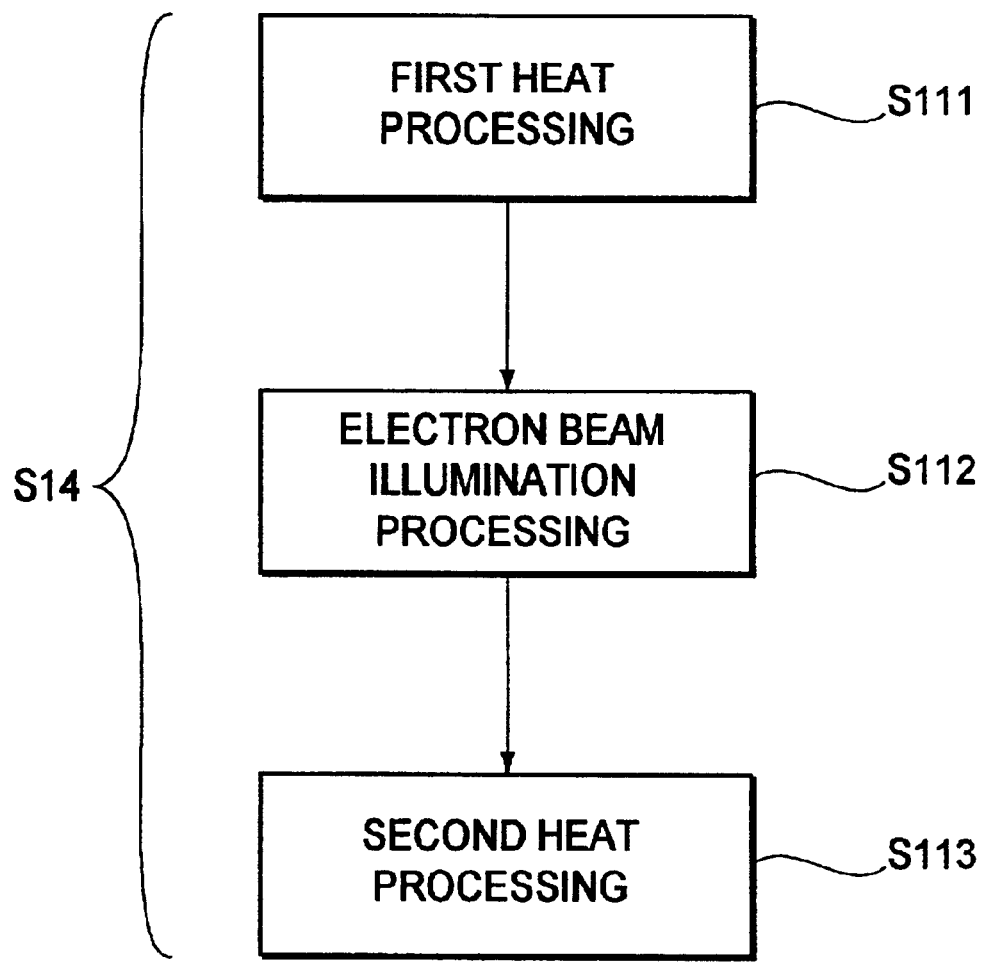
FIG. 11 is a flow chart showing a series of operation according to another embodiment of the present invention.

In the aforesaid embodiment, the electron beam is radiated after the developing process and the resist is reformed. However, the resist may be reformed, for example, ahead of the development after exposure, with the electron beam radiation. Alternatively, the radiation may be after the resist coating process or before the etching process. In addition, radiation of the electron beam may be performed in the step 14 of the third heating step as shown in FIG. 8 without performing the radiation in the step 13. In that case, wafer W is heat processed at a first temperature (S111), as shown in FIG. 11 at first, then radiated with an electron beam (S112), after that, heat processed at a second temperature higher than the first temperature (S113). The reforming process can be performed more efficiently by heat processing the wafer at the first temperature lower than the second thereof before the electron beam radiation.

In addition, in the aforesaid embodiment, electron beam is used for hardening the resist, however, ultraviolet ray may be used alternatively.

Moreover, in the aforesaid embodiment a radiation chamber is filled with helium gas and the radiation process is performed. Alternatively, nitrogen gas may be used in the process.

In the description of the present embodiment, the wafer coated with the resist is taken as an example. However, the substrate is not limited to a wafer, for example, the present invention can be applied to a substrate such as a glass substrate for a liquid crystal apparatus. In addition, the patterns formed on the substrate surface is not limited to resist patterns. The present invention can naturally be applied to a substrate, for example, on which an insulation layer is formed (a SOD film).

As described above, in the present invention, because the resist is hardened and reformed by the electron beam in the state that the substrate is not completely dried after the developing process, deformation and breaking of a pattern caused by drying after the development and the surface tension of cleaning solution is prevented, and adhesion of the resist to the wafer can be improved.

The disclosure of Japanese Patent Application No.2000-246223 filed Aug. 15, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus, comprising:
   a development and cleaning portion developing a photo sensitive material on the substrate with a developing solution and cleaning the developing solution with a cleaning solution; and
   a radiating portion radiating an electron beam on the photo sensitive material before the photo sensitive material and the cleaning solution are dried out.

2. The apparatus as set forth in claim 1,
   wherein the radiating portion is capable of forming a hermetic zone capable of reducing a pressure.

3. The apparatus as set forth in claim 2, further comprising:
   a gas supplying mechanism supplying an inert gas to the hermetic zone.

4. The apparatus as set forth in claim 1, further comprising:
   a supplying mechanism supplying a surface-active agent on the substrate.

5. The apparatus as set forth in claim 1, further comprising:
   a first chamber;
   a second chamber; and
   wherein the development and cleaning portion is disposed in the first chamber and the radiating portion is disposed in the second chamber different from the first chamber.

6. The apparatus as set forth in claim 1, further comprising:
   a selecting portion selecting the depth of radiation of the electron beam.

7. A substrate processing apparatus, comprising:
   a development and cleaning portion developing a photo sensitive material on the substrate with a developing solution and cleaning the developing solution with a cleaning solution; and
   a radiating portion, capable of forming a hermetic zone capable of reducing a pressure, radiating a beam with a wavelength shorter than that of a visible ray on the photo sensitive material before the photo sensitive material and the cleaning solution are dried out.

8. The apparatus as set forth in claim 7, wherein the beam is an ultraviolet ray.

9. The apparatus as set froth in claim 7, further comprising:
   a gas supplying mechanism supplying an inert gas to the hermetic zone.

10. The apparatus as set froth in claim 7, further comprising:
    a supplying mechanism supplying a surface-active agent on the substrate.

11. The apparatus as set forth in claim 7,
    a first chamber;
    a second chamber; and
    wherein the development and cleaning portion is disposed in the first chamber and the radiating portion is disposed in the second chamber different from the first chamber.

12. The apparatus as set forth in claim 7, further comprising:
    a selecting portion selecting the depth of radiation of the radiated beam.

* * * * *